United States Patent
Palara

[11] Patent Number: 5,990,535
[45] Date of Patent: Nov. 23, 1999

[54] POWER INTEGRATED CIRCUIT

[75] Inventor: Sergio Palara, Acitrezza, Italy

[73] Assignee: SGS-Thomson Microelectronics, S.r.l., Agrate Brianza, Italy

[21] Appl. No.: 08/634,287

[22] Filed: Apr. 18, 1996

[30] Foreign Application Priority Data

Jun. 30, 1995 [EP] European Pat. Off. ............... 95830279

[51] Int. Cl.⁶ ........................... H01L 29/76; H01L 29/94; H01L 29/00
[52] U.S. Cl. ........................... 257/500; 257/370; 257/371
[58] Field of Search ................................. 257/500, 501, 257/502, 378

[56] References Cited

U.S. PATENT DOCUMENTS 4,814,288  3/1989  Kimura et al. .............................. 438/59
5,602,416  2/1997  Zambrano ................................. 257/500

FOREIGN PATENT DOCUMENTS

0 239 060 A2  9/1987  European Pat. Off. .
0 403 016 A2  12/1990  European Pat. Off. .
59-2344  1/1984  Japan .
3-57266  12/1991  Japan .

*Primary Examiner*—Wael Fahmy
*Attorney, Agent, or Firm*—David V. Carlson; John C. Stewart; Seed and Berry LLP

[57] ABSTRACT

A power integrated circuit including a substrate of semiconductor material having a first conductivity type on which is formed a first epitaxial layer of the same conductivity type. In a first portion of the first epitaxial layer are formed first and second diffused regions having respectively first and second conductivity type. The first and the second diffused regions are isolated from a power stage included partially in a second portion of the first epitaxial layer by an annular region having the second conductivity type. Over the first epitaxial layer is formed a second epitaxial layer having the first conductivity type in which are extended the first and the second diffused regions to permit forming a control circuitry for the power stage.

25 Claims, 8 Drawing Sheets

POWER INTEGRATED CIRCUIT

BACKGROUND OF THE INVENTION

1. Field of the Invention

The present invention relates to a power integrated circuit and to a related manufacturing process.

2. Description of the Related Art

In conventional power integrated circuit technologies, in which the power stage is preferably of the vertical DMOS type of structure, some limitations are present when these technologies are used in high-frequency applications or when the substrate includes high-voltage (e.g. >300V/μsec) transients. These limitations are due to the presence of high junction capacitances between the substrate and diffused and isolated regions having respectively an N-type and a P-type conductivity and including the control circuitry of the power stage. The dimensions of these junction capacitances are proportional to the dimensions of the diffused and isolated regions. When there are abrupt changes in the voltage present on the substrate these junction capacitances transmit disturbances to the control circuitry of the power stage and compromise its operation. It would therefore be necessary either to reduce drastically the dimensions of the control circuitry or provide in the substrate a low resistance through which conveying to a ground terminal a large part of the current injected capacitively from the substrate to the control circuitry.

A known technical solution for solving these problems is described in European Patent Applications 95830060.0 and 94830229.4, both of the same applicant.

The first patent application describes a process for providing a power integrated circuit including a semiconductor substrate in which is diffused a region having an N-type conductivity. The diffused region is isolated from the substrate by an implanted buried region having a P-type conductivity. Specifically, the buried region is formed implanting high-energy boron. Normally the buried region has a thickness of approximately 1 μm and a distance from the integrated circuit surface dependent upon the implantation energy. For example, if the implantation energy used is around 900 kev the buried region will be at a depth of approximately 1.5 μm. To connect the buried region with the integrated circuit surface there is formed through an implantation and a successive diffusion a deep region having a P-type conductivity. The deep region includes two structurally independent regions which contact laterally the buried region. The buried region and the deep region form an annular region including the diffused region. The annular region isolates the diffused region from the rest of the integrated circuit. In this solution the thickness of the diffused region is on the order of 1 μm depending also on the doping of the region. But this thickness is insufficient if the diffused region must also include the control circuitry of the power stage.

The second patent application describes a process for providing a power integrated circuit including a control circuitry incorporated in first and second diffused regions having respectively an N-type conductivity and a P-type conductivity. Again in this case the first and second diffused regions are isolated from the rest of the integrated circuit through an annular region including a buried region, implanted with high energy, and a deep region. When the implantation of the buried region is performed at 900 kev the depth at which the buried region is located does not exceed 2 μm. Considering that the thickness of the buried region is approximately 1 μm the residual thickness towards the surface of the integrated circuit is approximately 1 μm. This thickness is insufficient for providing the control circuitry of the power stage. Indeed, the thermal cycles necessary for forming the power stage cause rising of the buried region to the surface. This shortcoming could be avoided implanting the buried region at much higher energy but the entire process would be much costlier.

SUMMARY OF THE INVENTION

It is an object of the present invention to provide a power integrated circuit and a related manufacturing process which would have better breakdown voltage for equal manufacturing cost or which for equal breakdown voltage would have smaller manufacturing cost.

The solution idea underlying the present invention is to grow on the power integrated circuit surface an epitaxial layer to increase the thickness of the P-type and N-type diffused regions including the control circuitry of the power stage.

The preferred embodiment of the invention is implemented in a power integrated circuit including a substrate of semiconductor material having a first conductivity type on which is formed a first epitaxial layer of the same conductivity type. In a first portion of the first epitaxial layer are formed first and second diffused regions having respectively first and second conductivity type. The first and the second diffused regions are isolated from a power stage included partially in a second portion of the first epitaxial layer by an annular region having the second conductivity type. Over the first epitaxial layer is formed a second epitaxial layer having the first conductivity type in which are extended the first and the second diffused regions to permit forming a control circuitry for the power stage.

The features and advantages of the integrated circuit and related maufacturing process according to the present invention will become apparent from the following description of an embodiment thereof, given by way of example and not limitation, with reference to the accompanying drawings.

DETAILED DESCRIPTION OF THE PREFERRED EMBODIMENT

The figures of the accompanying drawings generally and schematically illustrate a power integrated circuit and a related manufacturing process in accordance with the invention.

For convenience of explanation a preferred embodiment of the inventive power integrated circuit is now described with reference to its manufacturing process.

Figure 1:
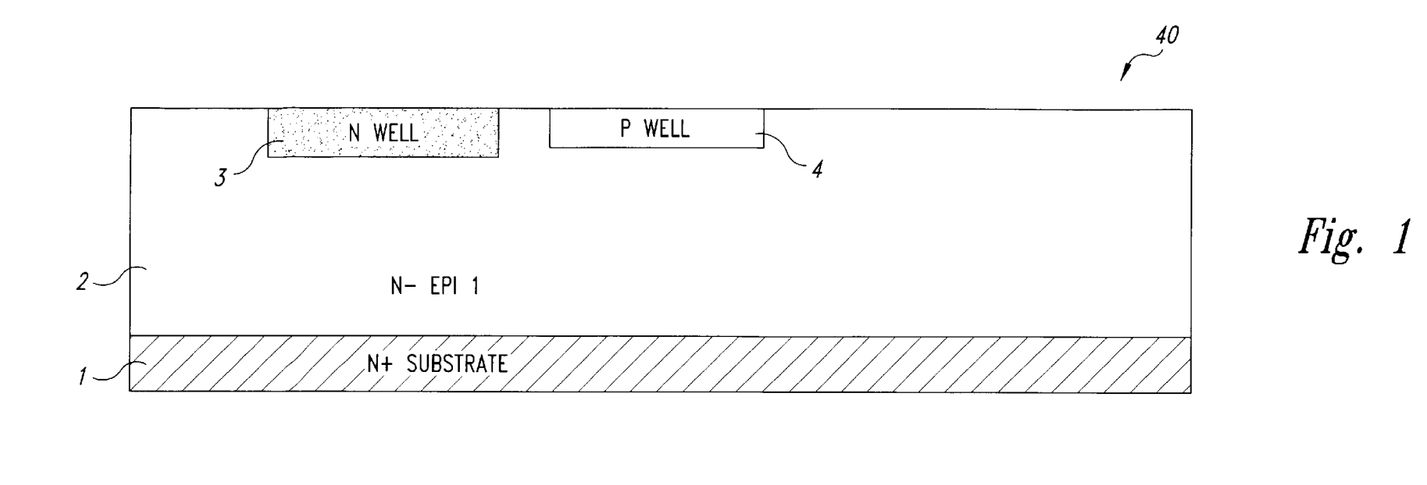
FIGS. 1 to 9 show in enlarged scale and vertical cross section a semiconductor substrate on which are performed in succession the steps of the manufacturing process for the power integrated circuit in accordance with the present invention.

As shown in FIG. 1 the power integrated circuit 40 includes a semiconductor material substrate 1, e.g. silicon, having a first conductivity type, in particular $N^+$-type. On the substrate 1 is grown a first epitaxial layer 2 having the same conductivity type of the substrate and in particular $N^-$-type.

Figure 2:
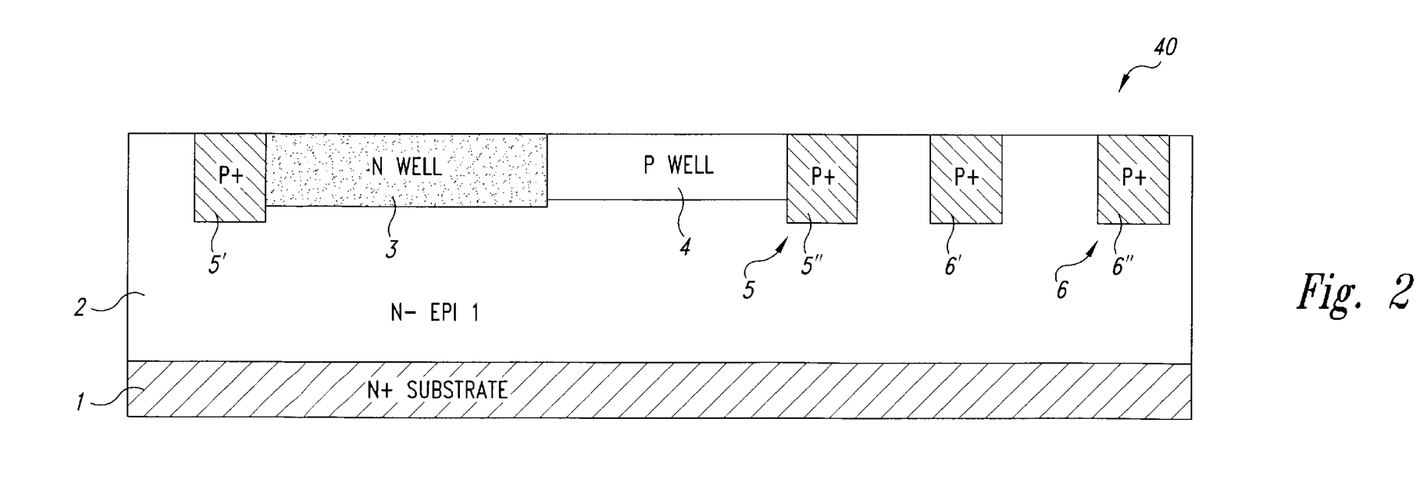

With reference to FIG. 2, on the surface of the power integrated circuit 40 is deposited a first mask provided by known techniques. In exposed portions of the first epitaxial layer 2 are implanted and successive diffused a diffused region 3 having the first conductivity type, in particular N-type, and a diffused region 4 having a second conductivity type, in particular P-type. Successively in other exposed portions of the first epitaxial layer 2 are implanted and succesive diffused deep regions 5 and 6 having the second conductivity type, in particular $P^+$-type. The deep regions 5 and 6 include each two structurally independent regions designated respectively 5', 5" and 6', 6". Simultaneously there is provided another diffusion of the diffused regions 3 and 4. As will be understood by those skilled in the art, the deep region 5 is preferably annular in topology. The term "annular" is used herein to mean a closed region and preferably is generally rectangular or opposed to circular. The deep region 6 is also preferably annular viewed from the top surface of the device.

Figure 3:
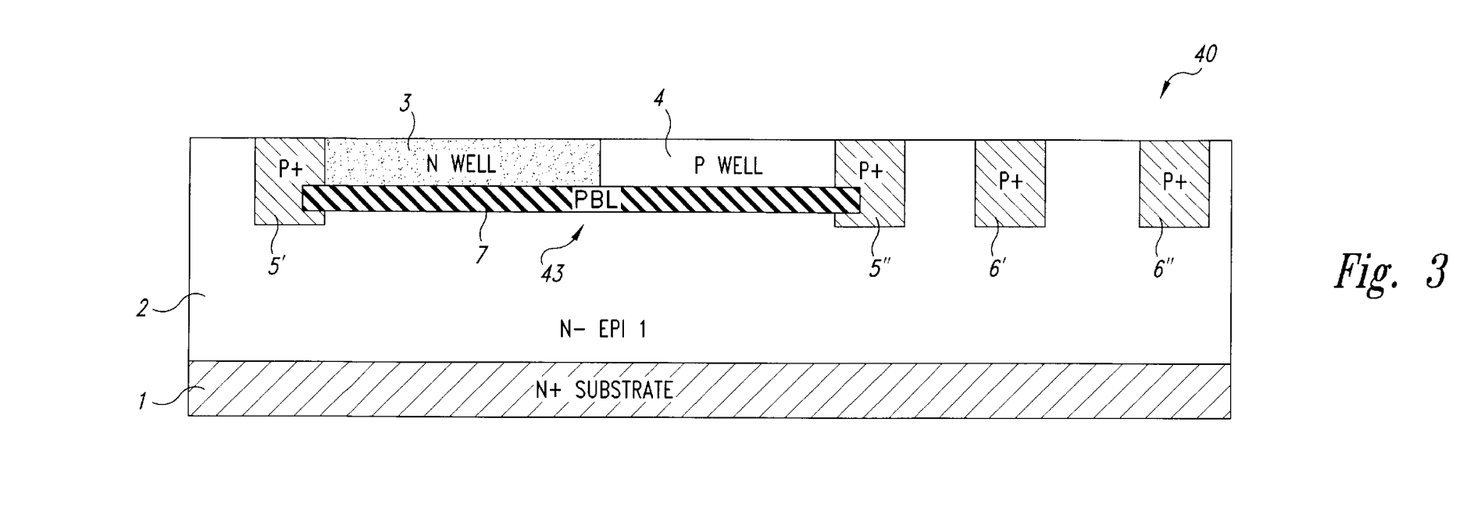

As shown in FIG. 3 a second mask is deposited to form opposite the diffused regions 3 and 4 a buried region 7. The buried region 7 is obtained by an high-energy implantation, e.g. 900 kev, of ions of a dopant having the second conductivity type, e.g. boron. The buried region 7 has a depth dependent on the implantation energy, e.g. at 900 kev the buried region is at a depth of approximately 1.5 $\mu$m. In addition the buried region 7 is limited laterally by the deep region 5 with which it forms an annular isolation region 43 enclosing the diffused regions 3 and 4.

Figure 4:
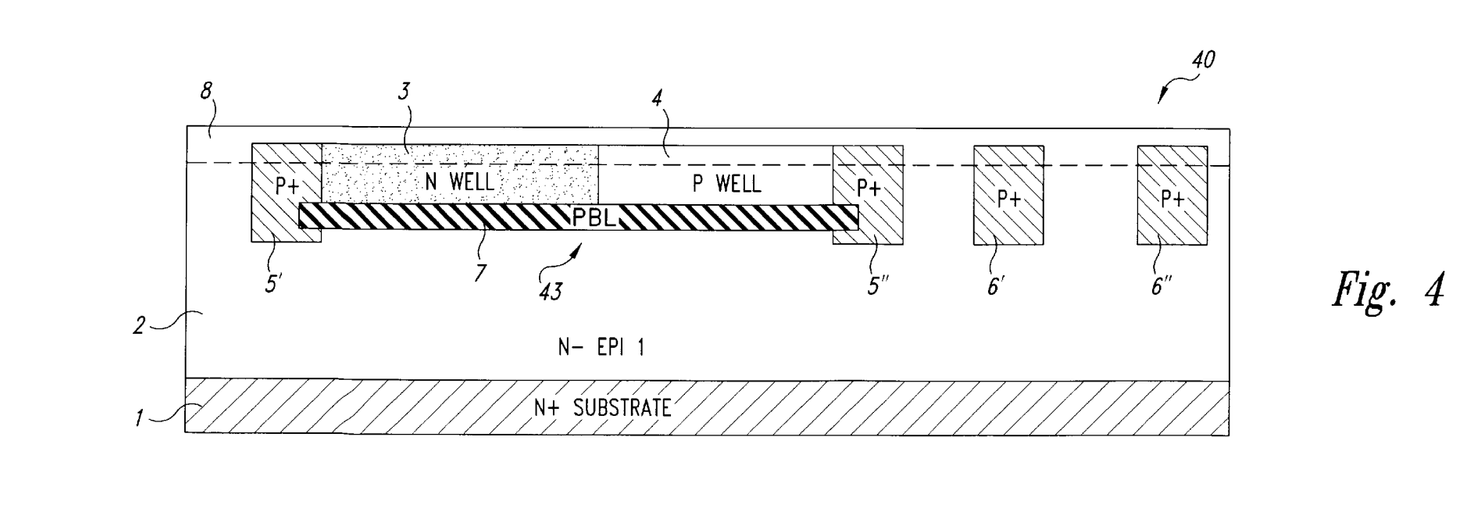

With reference to FIG. 4, after removal of the second mask is grown on the first epitaxial layer 2 a second epitaxial layer 8 having the first conductivity type and in particular N--type and a thickness of a few $\mu$m, e.g. 2 $\mu$m. The diffused regions 3 and 4 and the deep regions 5 and 6, during the successive diffusion heat treatments to which will be subjected the integrated circuit 40 will diffuse partially in the second epitaxial layer 8 increasing their thickness.

Figure 5:
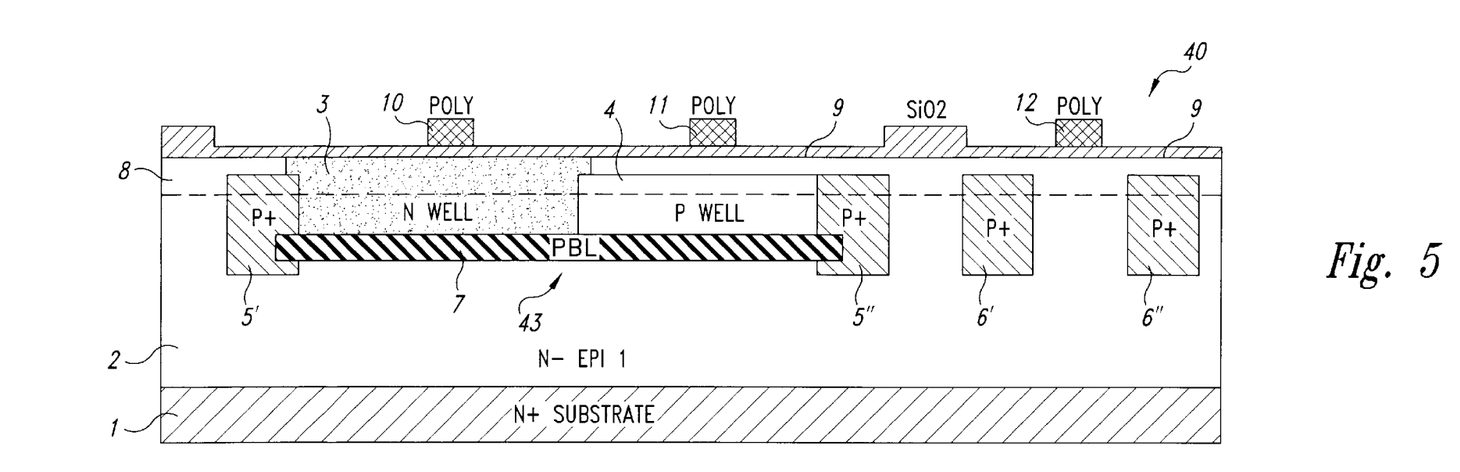

As shown in FIG. 5, on the surface of the integrated circuit 40 is grown a thin oxide layer 9. Successively there are deposited polycrystalline silicon layers designated with 10, 11 and 12.

Figure 6:
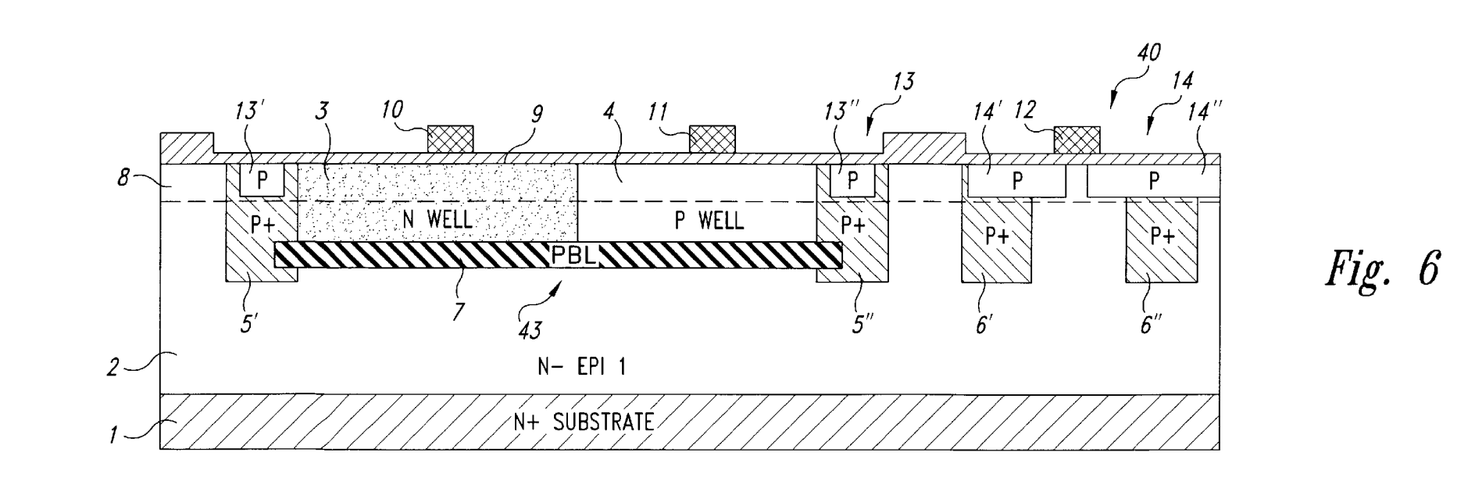

With reference to FIG. 6, there are then formed through an implantation and successive diffusion heat treatment diffused regions 13 and 14 having the second conductivity type. The diffused regions 13 and 14 include each two structurally independent regions respectively designated with 13', 13" and 14',14". In particular the diffused region 13 performs the contact of the annular isolation region 43 with the surface of the integrated circuit enclosing and isolating completely the diffused regions 3 and 4 from the rest of the integrated circuit 40.

Figure 7:
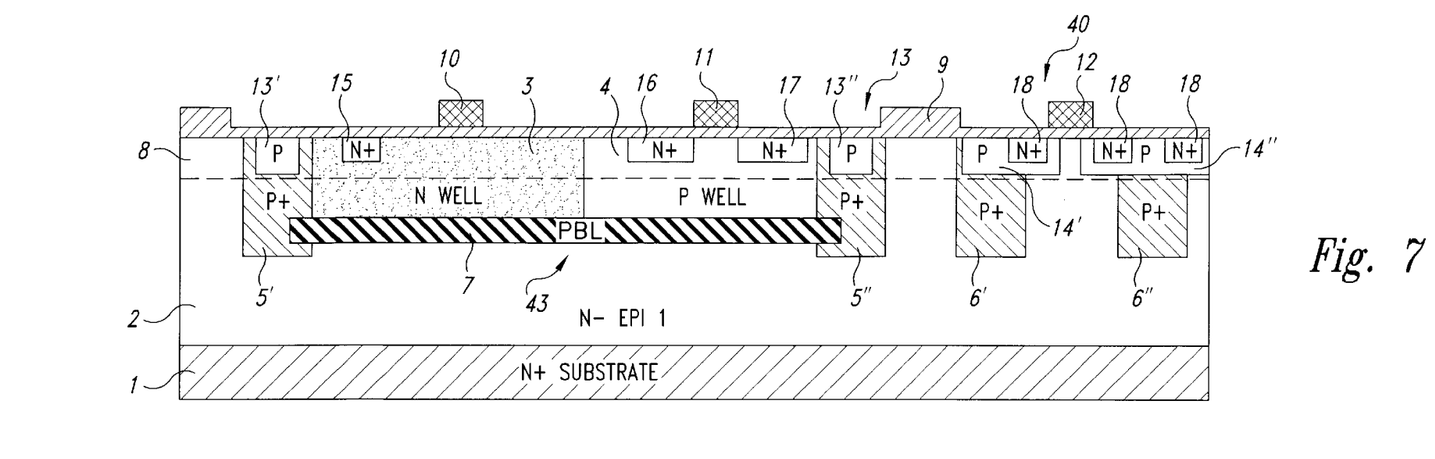
Figure 8:
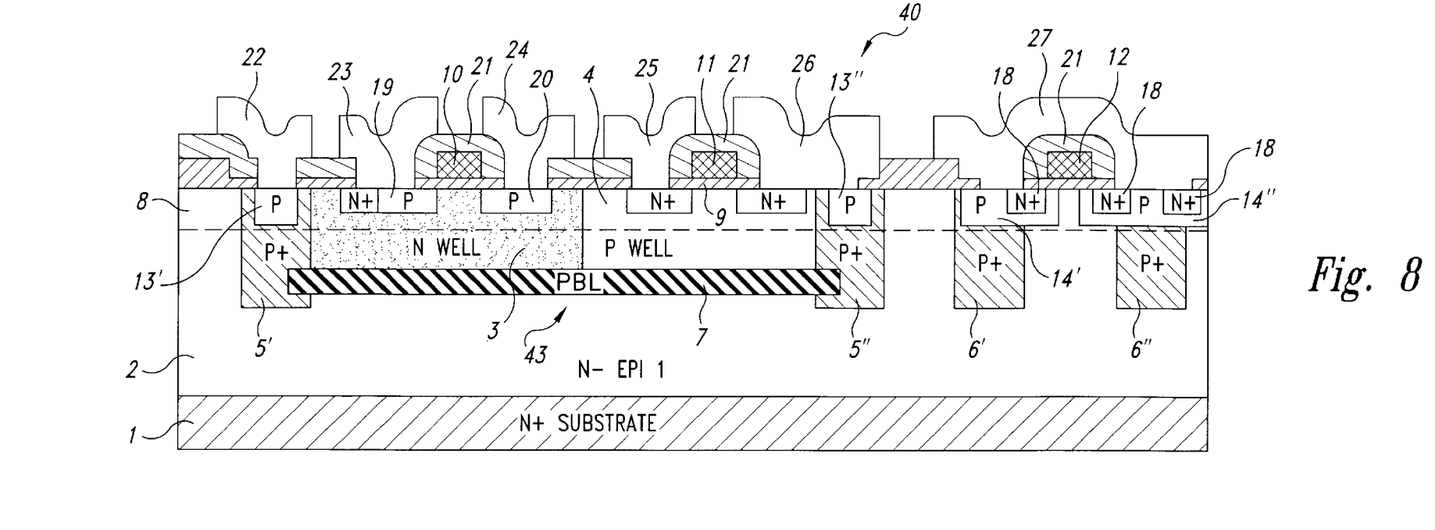

As shown in FIG. 7 and in FIG. 8 one then proceeds with implantation and successive diffusion of diffused regions 15, 16, 17 and 18 having the first conductivity type, and in particular $N^+$-type, and diffused regions 19 and 20 having the second conductivity type. The manufacturing process of the integrated circuit 40 then proceeds in the conventional manner with the deposit of a passivating material layer 21, with the opening of the contacts and with the deposit of metallizations 22, 23, 24, 25, 26 and 27.

Figure 9:
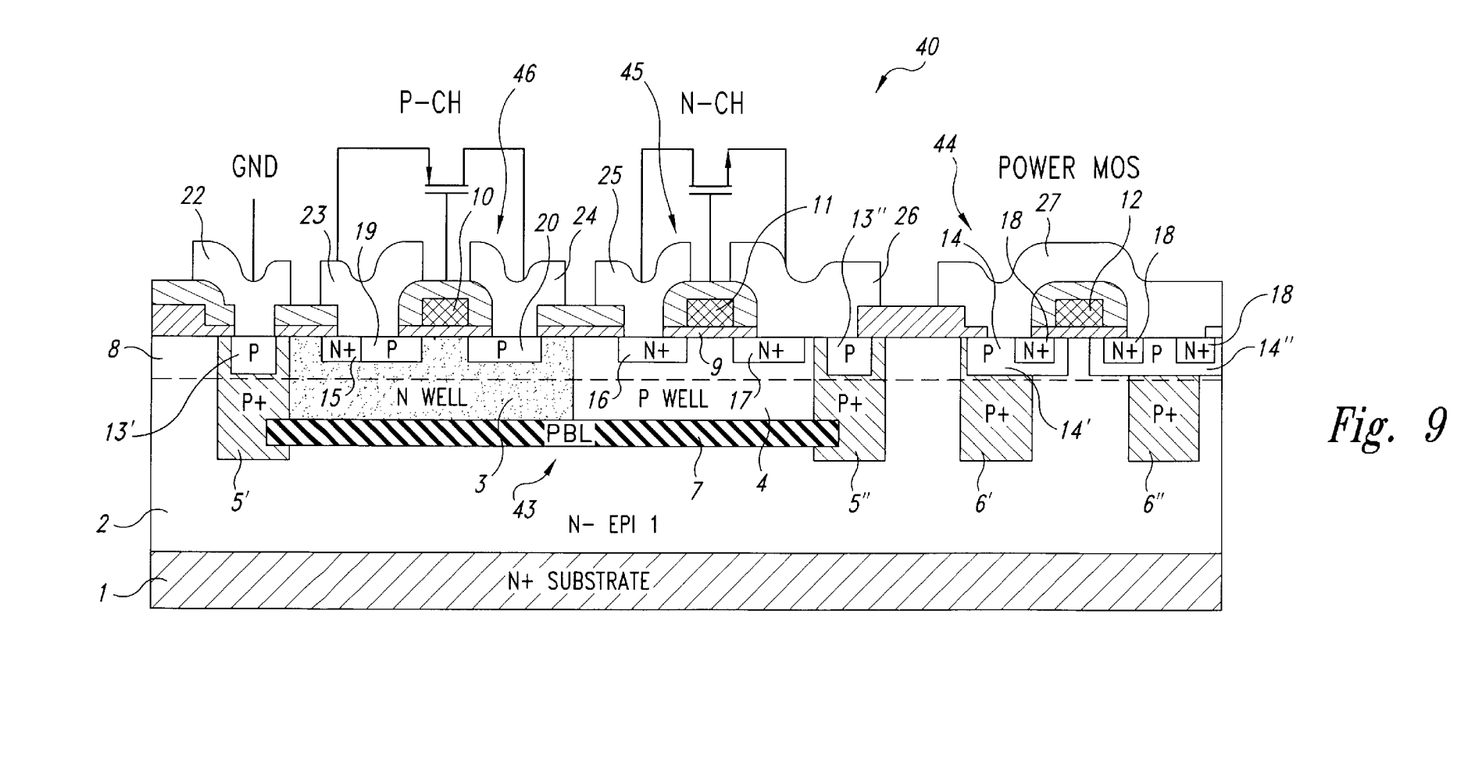

With reference to FIG. 9, the diffused regions 15 and 19 form a source region of a signal P-channel MOS transistor 45 which is included in the diffused region 3. The signal transistor 45 also includes a gate region formed by the polycrystalline silicon layer 10 and a drain region formed by the diffused region 20. In addition the diffused regions 16 and 17 form respectively a source region and a drain region of a signal N-channel MOS transistor 46 which is provided in the diffused region 4. The signal transistor 46 also includes a gate region formed by the polycrystalline silicon layer 11.

Again with reference to FIG. 9, the diffused region 14 forms body regions of a power transistor 44 having a vertical DMOS type of structure. The power transistor 44 also includes a source region formed by the diffused region 18 and a drain region included in the substrate 1 and in the first epitaxial layer 2. The power transistor 44 also includes a gate region formed by the polycrystalline silicon layer 12. In addition, the metallization 22 provides the contact of the annular isolation region 43 and of the diffused region 13 with a ground terminal GND at which is also connected the source region of the signal transistor 45.

Figure 10:
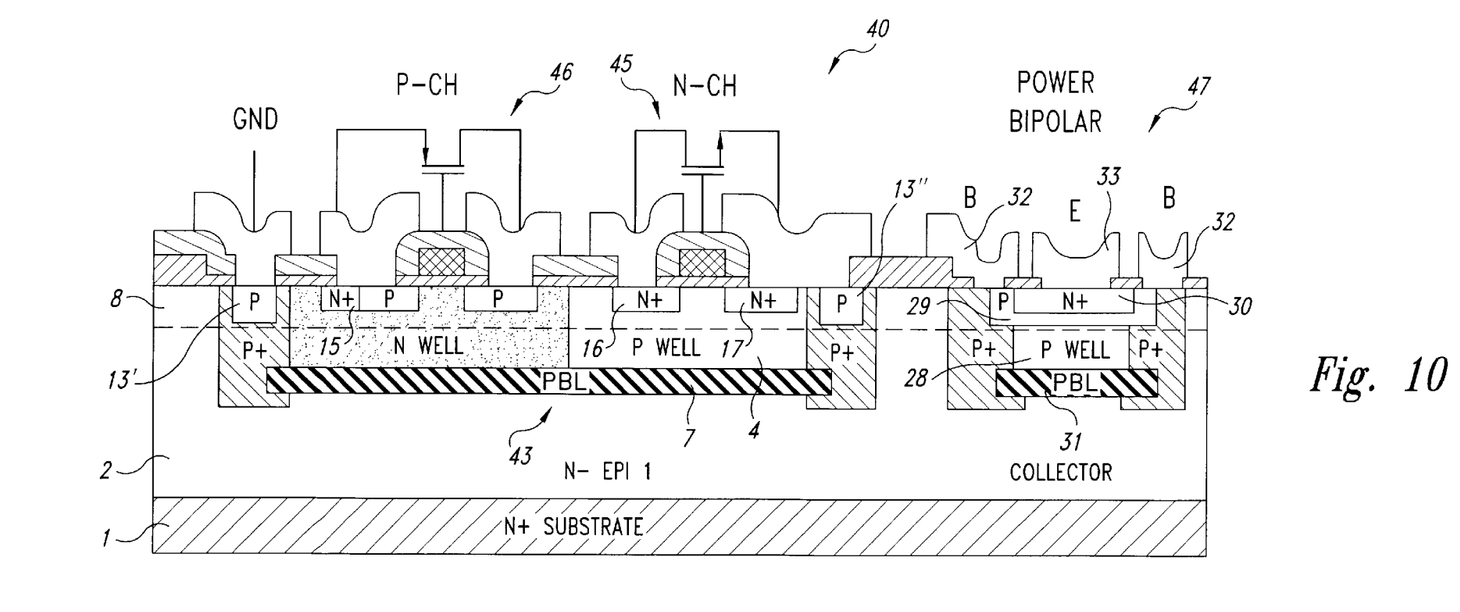
FIG. 10 shows in enlarged scale and vertical cross section an embodiment of the power integrated circuit of FIGS. 1–9.

As shown in FIG. 10, without change the manufacturing process steps of the integrated circuit 40 it's possible to replace the power transistor 44 with a power bipolar transistor 47 having vertical current flow. Specifically, the power bipolar transistor 47 includes a collector region included in the substrate 1 and in the first epitaxial layer 2, an emitter region 30 and a base region including a buried region 31, a diffused region 28 and a diffused region 29. The emitter region 30 is formed during the performance of the diffused regions 15, 16 and 17, while the buried region 31 is formed during the performance of the buried region 7. The diffused regions 28 and 29 are formed respectively during the performance of the diffused regions 4 and 13.

Figure 11:
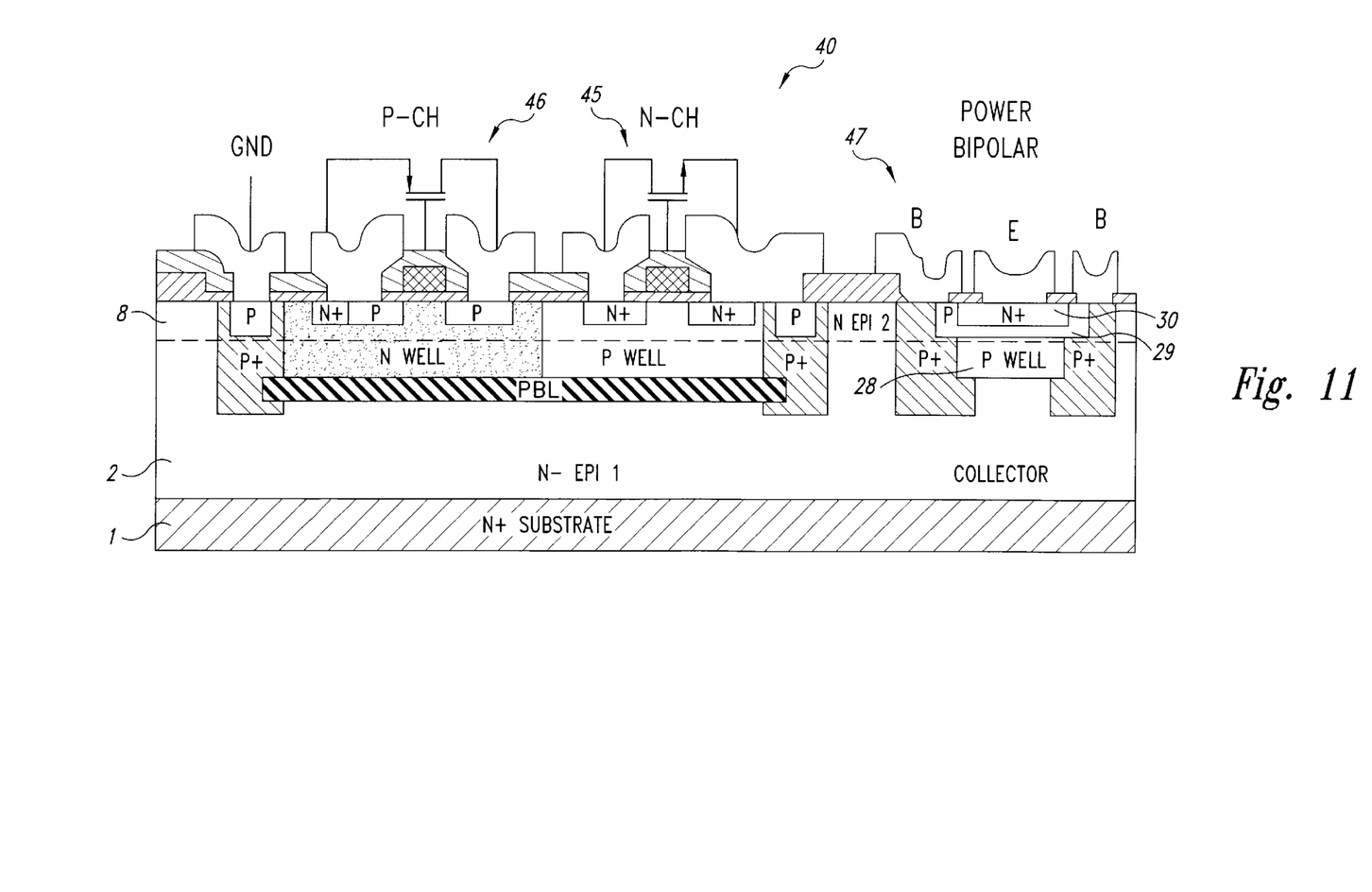
FIG. 11 is another embodiment of the power integrated circuit of FIGS. 1–9.
Figure 12:
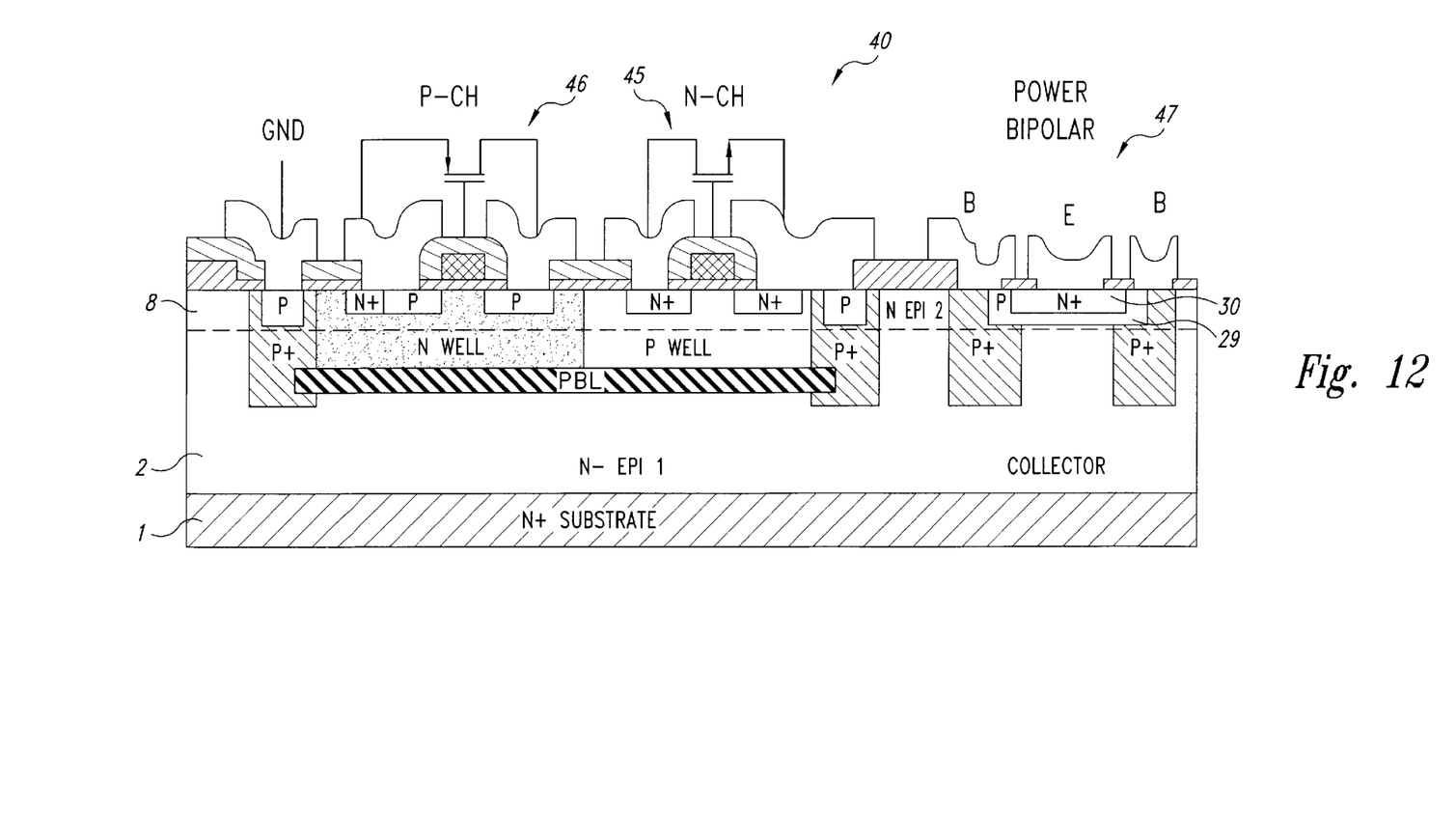
FIG. 12 another embodiment of the power integrated circuit of FIGS. 1–9.

As shown in FIG. 11 the power bipolar transistor 47 can also be provided with omission of the buried region 31 or omission either of the buried region 31 or the diffused region 28 as shown in FIG. 12.

In conclusion the introduction of the second epitaxial layer 8 causes the diffused regions 3 and 4 to exhibit a thickness such as to allow greater breakdown voltage of the signal transistors 45 e 46 for equal implantation energy of the buried region 7. In addition for equal breakdown voltage of the above mentioned transistors the buried region 7 can be implanted with a lower energy thus reducing process costs.

What is claimed is:

1. A power integrated circuit including:
   a substrate of semiconductor material having a first conductivity type;
   a first epitaxial layer of the same conductivity type of the substrate formed over the substrate and including an isolation region having a second conductivity type;
   first and second diffused regions having respectively the first and the second conductivity type enclosed by the isolation region; and
   a second epitaxial layer having the first conductivity type formed over the first epitaxial layer and in which are partially extended the first and the second diffused regions so as to form a retrograde well structure of the first and the second diffused regions.

2. Integrated circuit of the claim 1, wherein the second epitaxial layer covers the isolation region.

3. Integrated circuit of claim 2, wherein in the second epitaxial layer is included a third diffused region having the second conductivity type and extending from the surface of the integrated circuit to the isolation region.

4. Integrated circuit of claim 3, wherein the third diffused region includes two structurally independent regions.

5. Integrated circuit of claim 4, wherein the second epitaxial layer has N-type conductivity.

6. Integrated circuit of claim 4, wherein the two stucturally independent regions included in the third diffused region have P-type conductivity.

7. Integrated circuit of claim 6, wherein therewith is associated a power MOS transistor whose active areas are included partially in the second epitaxial layer.

8. Integrated circuit of claim 6, wherein therewith is associated a power bipolar transistor whose active areas are included partially in the second epitaxial layer.

9. A power integrated circuit including:

a substrate of semiconductor material having a first conductivity type;

a first epitaxial layer of the same conductivity type of the substrate formed over the substrate and including an isolation region having a second conductivity type;

first and second diffused regions having respectively the first and second conductivity type enclosed by the isolation region; and a second epitaxial layer having the first conductivity type formed over the first epitaxial layer and in which are partially extended the first and the second diffused regions so as to form a retrograde well structure of the first and the second diffused regions, wherein the power integrated circuit also includes a power transistor whose active areas are provided partially in the second epitaxial layer.

10. Integrated circuit of claim 9, wherein the power transistor is of MOS-type.

11. Integrated circuit of claim 9, wherein the power transistor is of bipolar type.

12. A power integrated circuit including:

a substrate of semiconductor material having a first conductivity type;

a first epitaxial layer formed over the substrate and having the same conductivity type of the substrate;

first and second diffused regions included partially in a first portion of the first epitaxial layer and having respectively first and second conductivity types, said first and second diffused regions being isolated from a power stage included partially in a second portion of the first epitaxial layer by an annular region having the second conductivity type; and a second epitaxial layer formed over the first epitaxial layer and having the first conductivity type in which are extended the first and the second diffused regions, so as to form a retrograde well structure of the first and the second diffused regions, to permit forming a control circuitry for the power stage.

13. The integrated circuit of claim 12, wherein the control circuitry includes a first signal transistor having source and drain regions formed in portions of the first diffused region extended in the second epitaxial layer.

14. The integrated circuit of claim 13, wherein the control circuitry includes a second signal transistor having source and drain regions formed in portions of the second diffused region extended in the second epitaxial layer.

15. The integrated circuit of claim 14, wherein the annular region includes:

a buried region interposed between the lower surface of the first and the second diffused regions and the first epitaxial layer; and a deep region including two structurally independent regions which are extended from the second epitaxial layer to the first epitaxial layer limiting laterally the buried region and the first and the second diffused regions.

16. The integrated circuit of claim 15, wherein the second epitaxial layer includes a third diffused region having the second conductivity type, said third diffused region including two structurally independent region which are extended from the surface of the integrated circuit to the deep region, and wherein the third diffused region performs the contact of the annular region with the surface of the integrated circuit.

17. The integrated circuit of claim 15, wherein the first conductivity type is N and the second conductivity type is P.

18. The integrated circuit of claim 17, wherein the first and the second signal transistor are respectively P-channel MOS and N-channel MOS.

19. The integrated circuit of claim 18, wherein the power stage includes a power transistor having body regions included in the second epitaxial layer, said power transistor also including a source region formed in the body regions and a drain region included in the substrate and in the first epitaxial layer.

20. The integrated circuit of claim 19, wherein the power transistor has a vertical DMOS type of structure.

21. The integrated circuit of claim 18, wherein the power stage includes a power transistor having a collector region included in the substrate and in the first epitaxial layer, an emitter region included in the second epitaxial layer and a base region which extends from the surface of the integrated circuit to the collector region enclosing the emitter region.

22. The integrated circuit of claim 21, wherein the base region includes a fourth diffused region included in the second epitaxial layer and enclosing the emitter region, a second buried region included in the first epitaxial layer and a fifth diffused region interposed between the fourth diffused region and the second buried region.

23. The integrated circuit of claim 21, wherein the base region includes a fourth diffused region included in the second epitaxial layer and enclosing the emitter region and a fifth diffused region interposed between the fourth diffused region and the collector region.

24. The integrated circuit of claim 21, wherein the base region includes a fourth diffused region included in the second epitaxial layer and enclosing the emitter region.

25. The integrated circuit of claim 18, wherein the power transistor is a bipolar transistor having vertical current flow.

* * * * *